(12) United States Patent
Haraguchi et al.

(10) Patent No.: US 6,447,613 B1
(45) Date of Patent: Sep. 10, 2002

(54) SUBSTRATE DECHUCKING DEVICE AND SUBSTRATE DECHUCKING METHOD

(75) Inventors: Hideo Haraguchi, Toyonaka; Izuru Matsuda, Kadoma, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/443,145

(22) Filed: Nov. 19, 1999

(30) Foreign Application Priority Data

Nov. 19, 1998 (JP) ............................. 10-328695

(51) Int. Cl.$^7$ .................... C23C 16/00; H05H 1/00; H01L 21/00
(52) U.S. Cl. .................... 118/728; 118/723 E; 156/345; 438/716
(58) Field of Search .................... 156/345; 118/728, 118/729, 731, 733, 723 E, 723 I, 723 MW, 715; 438/716, 715, 710, 706; 427/585

(56) References Cited

U.S. PATENT DOCUMENTS 5,879,128 A * 3/1999 Tietz t al. .................. 414/757
6,139,682 A * 10/2000 Iwata ........................ 156/345

FOREIGN PATENT DOCUMENTS

JP            8-316292 A    * 11/1996    .......... H01L/21/68

* cited by examiner

Primary Examiner—Gregory Mills
Assistant Examiner—P. Hassanzadeh
(74) Attorney, Agent, or Firm—Parkhurst & Wendel, L.L.P.

(57) ABSTRACT

It is the object of the invention to provide a substrate dechucking device and a substrate dechucking method for safely dechucking from a substrate holder a substrate which is being held in the substrate holder. The substrate dechucking device dechucks from the substrate holder a substrate which is being held in the substrate holder in a state where the substrate is electrically charged and bears residual suction force, said device comprising a lifter for lifting a substrate, said lifter being capable of protruding and retracting from the substrate holder, a drive source for generating a driving force to cause the lifter to protrude and retract, and a pair of magnetic coupling portions being disposed to face to each other, one of the pair of magnetic coupling portions being provided in a movable member which is moved by the drive source, the other of the pair of magnetic coupling portions being mounted to the lifter, thereby transmitting the driving force of the drive source to the lifter via the magnetic coupling portions.

10 Claims, 2 Drawing Sheets

SUBSTRATE DECHUCKING DEVICE AND SUBSTRATE DECHUCKING METHOD

BACKGROUND OF THE INVENTION

1. Field of the Invention

The present invention relates to a substrate dechucking device and substrate dechucking method for dechucking from the substrate holder a substrate held in a substrate holder in a plasma processing apparatus, which is used in a thin film formation process, or a patterning process in the manufacture of a semiconductor device, liquid crystal display panel, or photovoltaic cell.

2. Description of the Related Art

Efforts have been vigorously undertaken in recent years to realize plasma processing apparatus that are more precise, faster, capable of handling larger surface areas, produce less damage, and are highly reliable, in order to produce devices with higher functionality, while lowering the processing costs thereof. Uniform, accurate control of the temperature of a substrate on the inner surface of this substrate is required in particular for achieving film uniformity on a substrate in the process of forming a film on a substrate, and for ensuring dimensional accuracy in a dry etching process, which is used in pattern transfer. Consequently, as means for controlling substrate temperature, plasma processing apparatus, which make use of either mechanical suctions, or electrostatic suction electrodes, are coming into use.

A conventional plasma processing apparatus, which utilizes an electrostatic suction electrode, will be described hereinbelow. Examples of conventional plasma processing apparatus are disclosed in Japanese Patent Application Laid-open Nos. 63-72877, 2-7520, 3-102820, 4-100257, and 10-189544.

FIG. 2 is a cross-sectional view of the reaction chamber of a plasma processing apparatus shown in the above-mentioned Japanese Patent Application Laid-open No. 4-100257. This conventional plasma processing apparatus 30 will be explained hereinbelow.

In FIG. 2, 31 is a vacuum chamber, this vacuum chamber 31 has a gas inlet 31a, which is connected to an etching gas injecting device 32, and an exhaust opening 31b connected to an evacuation device 33. Inside the vacuum chamber 31 there is provided an electrostatic suction electrode 35, which has a surface that is an insulating layer, and has a pair of internal electrodes (not shown in the figure) on the inside, and which electrostatically sucks a to-be-processed substrate (hereafter referred to simply as substrate) 34. To the electrostatic suction electrode 35 are connected a direct current power supply 36 for electrostatically sucking a substrate 34, and a high frequency power supplying device 37. Furthermore, the direct current power supply 36 has a switching mechanism 38 for inversion.

Further, in the vacuum chamber 31, a quartz glass plate 39 is provided opposite the electrostatic suction electrode 35, and on the outside of the vacuum chamber 31, an ultraviolet light source 40, such as a mercury lamp, for example, is provided opposite the quartz glass plate 39. There is also a lifting mechanism (not shown in the figure), which raises and lowers a substrate 34 for placing and removing a substrate 34 on/from the electrostatic suction electrode 35. This lifting mechanism utilizes a sliding seal, such as a bellows.

The operation of a conventional plasma processing apparatus 30 constituted in this manner will be explained. First, a substrate 34 placed on top of the electrostatic suction electrode 35 by the lifting mechanism is secured to the surface of the electrostatic suction electrode 35 by applying +voltage and −voltage, respectively, from the direct current supply 36 to a pair of internal electrodes inside the electrostatic suction electrode 35. And then, in this state, ordinary plasma processing is performed on the substrate 34.

When plasma processing is complete, a residual electric charge remains in the insulating layer of the surface of the electrostatic suction electrode 35 even after the direct current supply 36 has been shut off, and the substrate 34 is maintained in the state of being sucked to the electrostatic suction electrode 35. Consequently, if a substrate 34 is lifted by the lifting mechanism in this state as-is, there are cases in which this substrate 34 is damaged.

To prevent this kind of trouble, and to stably lift a substrate 34 from an electrostatic suction electrode 35 without causing damage thereto, the following method for dechucking a substrate 34 from an electrostatic suction electrode 35 is being used.

That is, once plasma processing is complete, after negating the residual electric charge in a substrate 34 by applying a direct current voltage, which inverts polarity, to the internal electrodes of the electrostatic suction electrode. 35 in accordance with the switching mechanism 38, the lifting mechanism is operated, and the substrate 34 is removed from the electrostatic suction electrode 35. Further, thereafter, ultraviolet light of the ultraviolet light source 40 is irradiated onto the insulating layer surface of the electrostatic suction electrode 35 via the quartz glass plate 39 in an attempt to extinguish the residual electric charge of the surface of the electrostatic suction electrode 35.

However, the above-mentioned residual electric charge cannot be completely removed by simply applying a polarity-inversing direct current voltage to the internal electrodes of an electrostatic suction electrode 35 as described above. Further, when the application duration of the above-mentioned direct current voltage is too long, conversely, there are cases in which an electrostatic suction electrode 35 will suck a substrate 34. As a result thereof, there are cases in which the substrate 34 cannot be safely removed in accordance with the lifting mechanism, giving rise to trouble when the substrate 34 is to be transferred to the next process.

Further, because the above-mentioned lifting mechanism makes use of a sliding seal, such as a bellows, there is a limit to the endurance of a vacuum seal, and due to the deterioration over time of the spring force of the bellows, the balance between the residual suction force and the lifting force can break down. Thus, there is the above-mentioned problem of reliability with a conventional plasma processing apparatus 30.

Further, as another conventional example, there is a method, which utilizes an electricity-removing plasma, and which reduces residual electric charge by, for example, gradually lowering the power being applied. But the problem is that since the residual suction force is not directly monitored, in view of the temporal risk, there is a tendency to lengthen the plasma discharge duration, thereby lowering throughput.

The present invention is constituted to solve for problems such as these, and has as an object the provision of a substrate dechucking device and a substrate dechucking method, which enable a substrate held in a substrate holder to be safely dechucked from the substrate holder.

SUMMARY OF THE INVENTION

To solve for the above-mentioned problems, the present invention presents a substrate dechucking device which is provided with a substrate holder for holding a substrate in a state where the backside of the substrate makes contact with the holder, and which dechucks from the substrate holder a substrate being held in the substrate holder in a state where the substrate is electrically charged and has a residual suction force, this substrate dechucking device comprising a lifter for lifting a substrate, the lifter being capable of protruding and retracting from the substrate holder, a drive source for generating a driving force to cause the lifter to protrude and retract, and a pair of magnetic coupling portions disposed to face to each other, one of the magnetic coupling portions being mounted to a movable member which is driven to move by the drive source, the other of the magnetic coupling portions being mounted to the lifter side, thereby transmitting the driving force of the drive source to the lifter via the magnetic coupling portions.

According to this constitution, trouble can be prevented in the transfer process, and reliability can be enhanced by enabling a substrate held in a substrate holder to be safely dechucked from the substrate holder while canceling residual suction force of the substrate.

A substrate dechucking device of a first aspect of the present invention provides a substrate holder for holding a substrate in a state where contact is made with the backside of the substrate and which dechucks from the substrate holder a substrate being held in the substrate holder in a state where the substrate is electrically charged and has a residual suction force. This device comprises a lifter for lifting a substrate, said lifter being capable of protruding and retracting from the substrate holder, a drive source for generating a driving force to cause the lifter to protrude and retract, and a pair of magnetic coupling portions disposed to face to each other, one of the magnetic coupling portions being mounted to a movable member which is driven to move by the drive source, the other of the magnetic coupling portions being mounted to the lifter side, thereby transmitting the driving force of the drive source to the lifter via the magnetic coupling portions.

According to this constitution, by moving one of the magnetic coupling portions with the driving force of the drive source, a force resulting from the magnetic force generated between the magnetic coupling portions is applied to the other of the magnetic coupling portions, and the lifter connected to the side of this other of the magnetic coupling portions receives the driving force of the drive source, and a substrate being sucked to a substrate holder is biased in the lifting direction. In this case, because it is possible to perform a lifting operation by adjusting the acting force of the lifter on the substrate while adjusting the amount of travel for which the one of the magnetic coupling portions travels, the substrate can be safely dechucked from the substrate holder. In other words, since the positional difference between the one magnetic coupling portion and the other magnetic coupling portion enables generation of a linear functional lifting force which is substantially proportional to the difference in distance of movement therebetween, it is possible to achieve stable dechucking without forcibly bending the substrate.

A substrate dechucking device of a second aspect of the present invention is such that a substrate holder for holding a substrate in a state where contact is made with the backside of the substrate is disposed inside of a sealable vacuum chamber, and that a substrate being held in the substrate holder in a state wherein the substrate is electrically charged and has a residual suction force is dechucked from the substrate holder. This device comprises a lifter for lifting a substrate, said lifter being capable of protruding and retracting from the substrate holder and disposed inside of the chamber, a drive source for generating a driving power to cause the lifter to protrude and retract, said drive source being disposed outside the chamber, and magnetic coupling portions disposed outside and inside of the chamber respectively so as to face to each other through a portion constituting the vacuum chamber, the magnetic coupling portion disposed outside the chamber being mounted to a movable member which is moved by the drive source, the magnetic coupling portion disposed inside the chamber being mounted to the lifter side, thereby transmitting the driving force of the drive source to the lifter via the magnetic coupling portions.

According to this constitution, when one of the magnetic coupling portions is made as outside-the-chamber magnetic coupling portion, and the other of the magnetic coupling portions is made as inside-the-chamber magnetic coupling portion, the operational effect is the same as in the operational effect of the substrate dechucking device of the first aspect, and because the drive portion is also provided outside of the chamber, it is possible to do away with product defects resulting from the dust generated by the drive portion.

Further, the substrate dechucking device can comprise controlling means by providing a measuring device for measuring the difference in distance of movement between the magnetic coupling portion inside the chamber and the magnetic coupling portion outside the chamber in the lifting direction, so that the residual suction force between a substrate and the substrate holder is determined based on the difference in distance measured, thereby controlling the lifting operation. According to this constitution, because it is possible to determine (by way of pseudo-measurement) the residual suction force between a substrate and the substrate holder, so as to carry out a lifting operation while adjusting the force exerted on the substrate by the lifter, the substrate can be safely dechucked from the substrate holder.

Further, this controlling means is capable of performing control so that when the difference in distance of movement between the magnetic coupling portion inside the chamber and the magnetic coupling portion outside the chamber reaches a prescribed upper limit value during a lifting operation, the above-mentioned lifting operation is stopped for some time. According to this constitution, because a lifting operation can be performed while adjusting the force exerted on a substrate by the lifter so as not to become excessive, it is possible to prevent the substrate from breaking.

Further, this controlling means is capable of performing control so that, when the difference in distance of movement between the magnetic coupling portion inside the chamber and the magnetic coupling portion outside the chamber becomes not to exceed a prescribed lower limit value during a lifting operation for reducing suction force in order to reduce the residual suction force between a substrate and the substrate holder, the above-mentioned lifting operation for reducing the suction force is stopped, and a lifting operation for the next process transfer operation is performed. According to this constitution, a substrate can be safely dechucked from the substrate holder by gradually reducing the residual suction force between a substrate and the substrate holder.

Further, the chamber comprises a plasma generating device which generates plasma to cause electrical charging to the substrate. Also, the substrate holder has an electrode for electrostatic suction, and electrical charging to the substrate is caused by this electrostatic suction of a substrate to the substrate holder.

Furthermore, the measuring device may be a transmission-type displacement gauge which can be fixedly provided on the magnetic coupling portion disposed outside the chamber, that is in the ambient air space outside of the chamber. According to this constitution, too, a substrate can be safely dechucked from the substrate holder inside of the vacuum chamber.

A substrate dechucking method of a first aspect of the present invention is a substrate dechucking method for dechucking from a substrate holder a substrate being held in a state where there exists a residual suction force after cancellation of static electricity, the substrate dechucking method comprising: moving a first movable body which includes one magnetic coupling portion by a drive source; moving a second movable body which includes the other magnetic coupling portion by the magnetic force generated between the magnetic coupling portions, the other magnetic coupling portion being disposed to oppose the one magnetic coupling; and dechucking a substrate by means of a lifter provided on the second movable body. In this method, by moving the magnetic coupling portion of the first movable body, a substrate is dechucked from the substrate holder by the lifter moved by the second movable body via the magnetic force alone.

According to this method, by moving the magnetic coupling portion of the first movable body by a driving device, a force is applied to the other magnetic coupling portion by the magnetic force of the former magnetic coupling portion and locomotive movement is transmitted to a second movable body coupled to the other side of the latter magnetic coupling portion, and a substrate sucked to the substrate holder is urged in the lifting direction. In this case, it is possible to perform a lifting operation while adjusting the force exerted on a substrate by the lifting device by adjusting the amount of movement of the one magnetic coupling to be moved, so that a substrate can be safely dechucked from the substrate holder. In other words, the positional difference between the one magnetic coupling portion and the other magnetic coupling portion generates a linear functional lifting force which is substantially proportional to the difference in distance of movement therebetween, so that it possible to achieve stable dechucking without forcibly bending a substrate.

A substrate dechucking method of a second aspect of the present invention is a substrate dechucking method for dechucking from a substrate holder, in a sealable vacuum chamber, a substrate being held in a state where there exists a residual suction force after cancellation of static electricity, the substrate dechucking method comprising: moving a first movable body including one magnetic coupling portion and disposed outside of the vacuum chamber by a drive source; moving a second movable body including the other magnetic coupling portion in the lifting direction by the magnetic force of the magnetic coupling, the other magnetic coupling portion being disposed inside of the vacuum chamber and located to oppose the one magnetic coupling portion; and dechucking a substrate by means of a lifter provided on the second movable body.

In this method, a pair of magnetic coupling portions are provided respectively inside of the chamber and outside of the chamber such that they are opposed to each other through a portion constituting the chamber. By moving the magnetic coupling portion of a first movable body provided outside of the chamber, a force is applied to the magnetic coupling portion inside the chamber by the magnetic force of the magnetic coupling portion outside the chamber, and the lifter of the second movable body connected to the magnetic coupling portion inside the chamber is urged in the substrate lifting direction, thereby dechucking a substrate from the substrate holder.

According to this constitution, when the one of the magnetic coupling portions is made as outside-the-chamber magnetic coupling portion and the other as inside-the-chamber magnetic coupling portion, the same operational effect can be obtained as that of the substrate dechucking method of the first aspect.

Further, the difference in distance of movement between the magnetic coupling portion inside the chamber and the magnetic coupling portion outside the chamber in the lifting direction can be measured during a lifting operation, and the lifting operation can be performed in accordance with the difference in distance measured. According to this method, it is possible while adjusting the force exerted on the substrate by the lifter, to determine (by way of pseudo-measurement) residual suction force between a substrate and the substrate holder and to carry out a lifting operation, so that the substrate can be safely dechucked from the substrate holder.

Further, when the difference in distance of movement between the magnetic coupling portion inside the chamber and the magnetic coupling portion outside the chamber reaches a prescribed upper limit value during a lifting operation, the above-mentioned lifting operation is stopped for some time to return the magnetic coupling portion outside the chamber to the original position, and thereafter the above-mentioned lifting operation is repeated, so that the suction force between a substrate and the substrate holder can be reduced. According to this method, a lifting operation is performed while adjusting the force exerted on a substrate by the lifter so as not to become excessive, so that the substrate can be prevented from breaking.

Further, during a suction force reducing lifting operation in order for reducing the residual suction force between a substrate and the substrate holder, the above-mentioned lifting operation is repeated until the difference in distance of movement between the magnetic coupling portion inside the chamber and the magnetic coupling portion outside the chamber becomes not to exceed a prescribed lower limit value, and when the difference in distance becomes not to exceed a prescribed lower limit value, the above-mentioned lifting operation is stopped to perform a lifting operation for the next process transfer operation, thereby dechucking a substrate from the substrate holder. According to this method, a substrate can be safely dechucked from the substrate holder by gradually reducing the residual suction force between a substrate and the substrate holder.

Furthermore, the present invention is a plasma processing apparatus for performing dry etching of a substrate using plasma, comprising a sealable vacuum chamber (1) for accommodating therein a substrate which is to be subjected to plasma processing, a vacuum evacuation device (1b) for evacuating an internal gas from the chamber to create a vacuum state therein, a reaction gas supply device (1a) for introducing a reaction gas inside the chamber, a substrate holder (3) equipped with electrostatic suction electrodes (6) in which a substrate is placed and sucked to be held, a plasma gas-generating high-frequency power source device (11) which is connected to the electrostatic suction electrodes, direct current power source devices (8, 9) which are connected to the electrostatic suction electrodes for electrostatic suction of a substrate, and a substrate dechucking device for dechucking a processed substrate from a substrate holder, characterized in that this substrate dechucking device is actuated by the above-mentioned magnetic couplings.

Further, the present invention is a plasma processing method, wherein a substrate is transferred inside of a sealable vacuum chamber, a reaction gas is injected into the chamber after evacuating internal gas from the chamber to create a vacuum state therein, a plasma is generated in accordance with a high-frequency power source, and dry etching is performed on a substrate which is electrostatically sucked to the substrate holder, characterized in that the method for dechucking a substrate from the substrate holder in a state where there exists residual suction force after the etching process is completed is a method carried out using the magnetic force of the above-mentioned magnetic coupling.

According to this method, in order for dechucking a substrate from a substrate holder after the completion of the etching, a movable body outside of the chamber is moved, and a second movable body inside of the chamber which is linked to the former movable body only by a magnetic force is moved in the lifting direction, thereby dechucking the substrate. Thus, there is no need to provide any member which passes through the chamber to transmit a locomotive movement from outside of the chamber, so that the integrity of the vacuum chamber seal can be maintained.

DESCRIPTION OF THE PREFERRED EMBODIMENTS

As a specific example of a substrate dechucking device and substrate dechucking method related to an aspect of the embodiment of the present invention, an example of a reactive ion etching-type dry etching apparatus will be explained hereinbelow by referring to FIG. 1.

Figure 1:
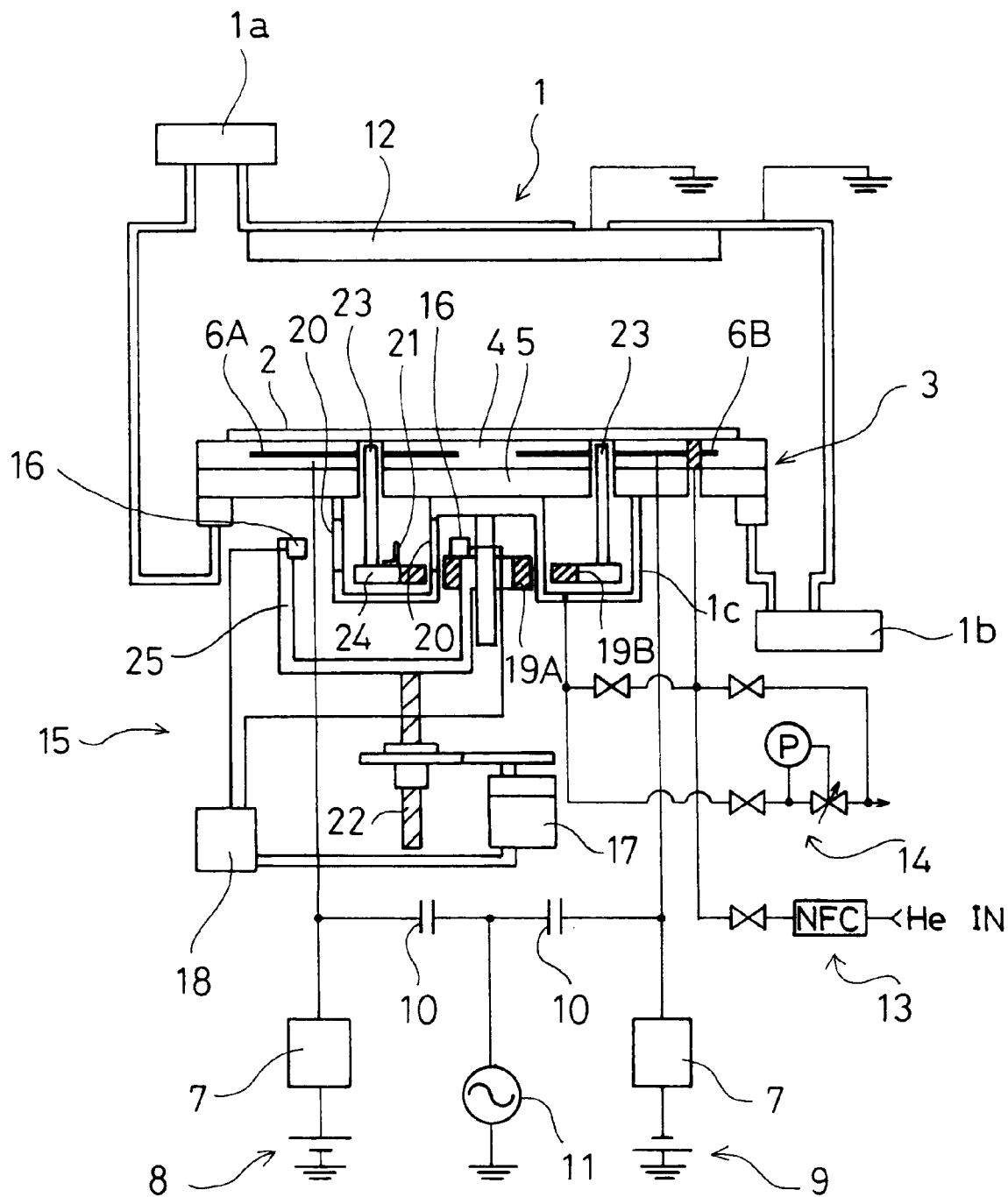
FIG. 1 is a cross-sectional view of a reaction chamber of a dry etching apparatus according to one embodiment of the present invention.
Figure 2:
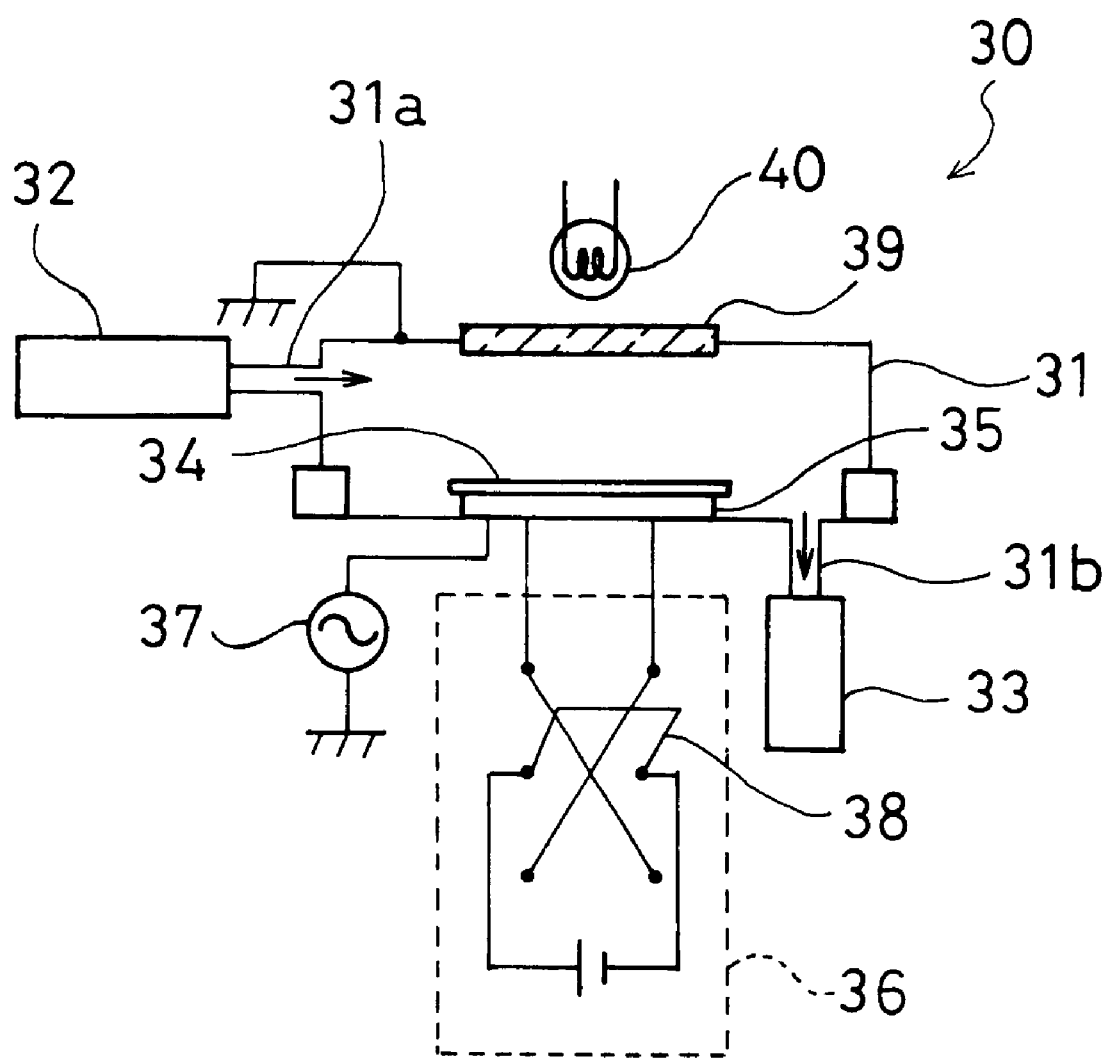
FIG. 2 is a cross-sectional view of a reaction chamber of a conventional dry etching apparatus.

In FIG. 1, 1 is a vacuum chamber, having reaction gas supply means 1a, which is connected to a gas supply device not shown in the figure, and vacuum evacuation means 1b, which is connected to a vacuum evacuation device not shown in the figure, 2 is a substrate comprising an Si wafer as the to-be-processed substrate, and 3 is an electrostatic suction-type substrate holder for holding this substrate 2. The substrate holder 3 comprises a 5 mm-thick alumina guiding portion 4, and an aluminum base portion 5, which has a cooling water channel (not shown in the figure) on the inside, and a pair of tungsten internal electrodes for electrostatic suction 6A, 6B are built into the substrate holder 3, 500·m inwards from the surface of the alumina guide 4. A high-frequency filter 7, a positive direct current power source 8, or a negative direct current power source 9, a capacitor 10, and a 13.56 MHz high-frequency power source 11 are electrically connected to the internal electrodes for electrostatic suction 6A, 6B. An upper electrode 12 is provided inside the vacuum chamber 1, and serves as a ground.

13 is a gas supply mechanism, comprising a valve and a flow controller, supplies He gas or some other heat transfer gas to the space between the backside of a substrate 2 and the surface of the substrate holder 3. 14 is a pressure monitoring and control mechanism, constituting a pressure gauge and a restrictor, monitors and controls the heat transfer gas pressure at the backside of a substrate 2.

The substrate holder 3 is provided with a substrate lifting mechanism 15 for lifting a substrate 2 from the substrate holder 3 in order to dechuck the substrate 2 from the substrate holder 3 when transferring the substrate 2. The substrate lifting mechanism 15 comprises a plurality of lifters 23, which are provided so as to be capable of protruding in the upward direction from the substrate holder 3; a circular disc portion 24, which supports this lifter 23; an outer ring 19B as inside-the-chamber magnetic coupling portion, which is mounted in a fixed condition to the inside perimeter side of a circular disc portion 24; an inner ring 19A as outside-the-chamber magnetic coupling portion which is provided correspondent to the inside perimeter of the outer ring 19B via the lower wall 1c as a component of the vacuum chamber 1; an inner ring support 25 which supports in a freely ascending and descending manner the inner ring 19A as a magnetic coupling portion; a ball screw 22, which is mounted to this inner ring support 25; a drive motor 17 as a drive source, which raises and lowers this ball screw 22; and a control circuit 18, which controls this drive motor 17.

And in the substrate lifting mechanism 15, whereas a lifter 23 and a circular disc portion 24, as well as an outer ring portion 19B as a magnetic coupling portion are provided on the inner side of the lower wall 1c of the vacuum chamber 1, that is, on the inside of the vacuum chamber 1, the inner ring 19A as a magnetic coupling portion, the inner ring support 25, the ball screw 22, the drive motor 17, and the control circuit 18 are provided outside the vacuum chamber 1.

Window portions 20, into which are inserted transparent plates, are formed in portions of the lower wall 1c of the vacuum chamber 1, a pair of transmission-type displacement gauges 16 are provided on the upper end portions of the inner ring support 25 so as to face one another through these windows 20, and a dog 21 is mounted at a location on top of a circular disc portion 24 so as to be positioned between these transmission-type displacement gauges 16. And then, when the outer ring 19B as the magnetic coupling portion constitutes a position that is to a certain extent relatively lower than the inner ring 19A as the magnetic coupling portion, a light or infrared ray generated between the transmission-type displacement gauges 16 is blocked by the dog 21, thereby reducing the transmission volume. Transmission-type displacement gauge 16 data is sent to the control circuit 18, and the drive motor 17 is subjected to feedback control.

The operation of a dry etching apparatus constituted as described above will be explained by referring to FIG. 1.

First, in a state wherein a substrate 2 has been placed on top of the substrate holder 3, the inside of the vacuum chamber 1 is evacuated, and 1.0 kV of positive, negative direct current is applied via a high-frequency filter 7 from direct current power sources 8, 9, respectively, to a pair of internal electrodes 6A, 6B. In accordance therewith, the substrate 2 is electrostatically sucked to the substrate holder 3. Next, He gas is introduced at a rate of 10 cc/minute to the backside of the substrate 2 in accordance with a gas supply mechanism 13, and pressure is adjusted to 10 Torr in accordance with at pressure control mechanism 14. Furthermore, $CF_4$ (30 cc/minute flow rate), which is a reaction gas, and $O_2$ (5 cc/minute flow rate) are simultaneously introduced inside the vacuum chamber 1 via the gas inlet of reaction gas supply means 1a, and pressure is adjusted to 200 m Torr, then, in accordance with supplying bifurcated high-frequency power from a high-frequency power source 11 to the pair of internal electrodes 6 via a capacitor 10, which blocks the direct current voltage, a plasma is generated, and the substrate 2 is subjected to the desired dry etching while the backside of the substrate 2 is efficiently cooled with He.

After etching is complete, the high-frequency power, reaction gas, and supply of He to the backside of the substrate 2 are shut off, and the outputs of the direct current power sources 8, 9 are shut off while evacuation is performed one time. In this state, the substrate 2 will have undergone the desired etching, but due to the electrical charge of the substrate 2 from the plasma, and the residual electrical charge existing between the insulating layer surface of the substrate holder 3 and the backside of the substrate 2, the substrate 2 is still being sucked. Therefore, if an attempt is made to dechuck the substrate 2 from the substrate holder 3 in accordance with the substrate lifting mechanism 15 in this state as-is, it will give rise to substrate 2 damage, and transfer troubles. These tendencies are especially great when the substrate 2 is an insulating material.

Accordingly, a process, which cancels this residual suction, will be performed next, but prior to performing this process, using a substrate 2 that has no residual charge as an initial setting, the substrate 2 is lifted beforehand by the substrate lifting mechanism 15. At this time, in accordance with the weight of the magnetic coupling outer ring 19B and the circular disc portions 24, and the weight of the substrate 2, the magnetic coupling outer ring 19B shifts to a certain extent, becoming relatively lower than the magnetic coupling inner ring 19A, and a repeatable initial positional difference (for example, 0.1–0.5 mm) exists on this occasion in the transmission-type displacement gauge 16. This data is monitored, and stored in advance in the control circuit 18 as data. Furthermore, because the repeatability of the initial set value is high, there is no need to change the substrate lifting mechanism 15 by taking it apart and re-assembling it.

In a state, wherein the above-mentioned initial setting has been prepared, after sucking a substrate 2 onto a substrate holder 3, the drive motor 17 of the substrate lifting mechanism 15 is driven, and the substrate 2 is lifted by the lifters 23 via the magnetic coupling. In this case, the substrate lifting mechanism 15 makes contact with the substrate 2, and when the substrate 2 is sucked due to a residual electrical charge, a relatively large positional difference occurs between the inner ring 19A and outer ring 19B of the magnetic coupling. The difference in distance of movement from the initial set value is detected by measuring this positional difference in accordance with the transmission-type displacement gauges 16 as the volume of shading of the dog 21 through the windows 20. And then, by detecting this difference in distance, a linear functional lifting force which is substantially proportional to the positional difference is artificially achieved by the lifters 23, and a determination is made by the control circuit 18. Here, because a transmission-type displacement gauge 16 is integrally fastened to the magnetic coupling inner ring 19A, by observing the relative height of the positional difference with the magnetic coupling outer ring 19B, the difference in distance of movement alone resulting from a residual suction force can be measured extremely well.

Furthermore, when the initial setting is made, the force exerted on a substrate 2 when the difference in distance of movement is greater than the above-mentioned initial positional difference is observed in advance, and, for example, when the difference in distance of movement is 5 mm, it is ascertained beforehand that only a force that is less than the shear stress limit of that material is exerted on the substrate 2, and this difference in distance of movement is stored in advance in the memory portion (not shown in the figure) of the control circuit 18 as the upper limit value. Further, the difference in distance of movement (for example, 1 mm) of when the residual suction force is reduced to the extent that substrate 2 damage and transfer trouble do not occur is stored in advance in the memory portion of the control circuit 18 as the lower limit value.

Further, because the transmission-type displacement gauges 16 are provided on the ambient air side, service life will be longer than if the transmission-type displacement gauges 16 were provided inside the vacuum chamber 1, precision reliability, and ease of wiring and replacement work are enhanced, and adjustments thereto are also simple, and since it is possible to ensure the distance between the transmission-type displacement gauges 16 and the substrate holder 3, which is the applied portion of the high-frequency power, there are no malfunctions of the transmission-type displacement gauges 16 resulting from noise. And the transmission-type displacement gauges 16 are further characterized in that high-frequency power efficiency does not drop.

When a substrate 2 is being lifted by the lifter 23, in cases where the material of the substrate 2 approaches the shear stress limit, and the difference in distance of movement reaches the upper limit value, the control circuit 18 causes the lifting operation to stop one time, and causes the lifters 23 of the substrate lifting mechanism 15 to descend. Thereafter, the control circuit 18 causes the lifters 23 of the substrate lifting mechanism 15 to rise once again in the prescribed range of motion of the magnetic coupling inner ring 19A, and the same lifting operation is repeated. In accordance with this repetitive operation, the areas in the vicinity of the portions of the substrate 2, which are in contact with the lifters 23, are gradually dechucked from the substrate holder 3, and the portion of the backside of the substrate 2 that is in contact with the substrate holder 3 gradually decreases. As a result thereof, the residual electrical charge between the surface of the alumina insulating layer 4 on the surface of the substrate holder 3 and the substrate 2 is also electrically neutralized having the residual He gas of the backside of the substrate 2 as a medium, and residual suction decreases.

In this manner, when the residual suction force is reduced to the extent that substrate 2 breakage and transfer trouble will not occur even if the magnetic coupling inner ring 19A is moved the prescribed distance, and the difference in distance of movement becomes not to exceed the lower limit value (for example, 1 mm), it is determined that residual suction has been canceled, the above-mentioned lifting operation for reducing suction force is stopped, and thereafter, as a lifting operation for the next process transfer operation, the substrate 2 is lifted at the maximum speed at which the substrate 2 will not be displaced, for example, 20 mm/second.

In this manner, once residual suction has been canceled, a substrate can be safely dechucked from the substrate holder 3, and as a result thereof, the substrate 2 can be stably transferred to the next process without trouble, making it possible to enhance throughput.

Here, in this aspect of the embodiment, since an electricity removing plasma process is not utilized, and there is no high-voltage electrode for corona discharge inside the vacuum chamber 1, no dust is generated by microsputtering, and no impurities/contaminants or dust is generated from the electrode material. Further, device damage (such as a shift in the threshold voltage of an MOS transistor, for example) is not induced. And in the unlikely event that suction force remains, since it can be detected with certainty, there is no substrate 2 damage resulting from forcible dechucking.

As mentioned above, according to this aspect of the embodiment, dechucking can be done safely while detecting and controlling lifting force, and residual suction, which is generated between a substrate 2 and a substrate holder 3 as a result of electrostatic suction and plasma processing, enabling plasma processing to be performed stably, without substrate 2 device damage or dust generation, and furthermore, without substrate 2 transfer trouble.

Furthermore, in the above-described aspect of the embodiment, a transmission-type displacement gauge was used as measuring means, but it is not limited to this, and any device capable of detecting the difference in distance of movement between the inner ring 19A and the outer ring 19B will suffice. Shape-wise, it is desirable for the sake of accuracy that the transmission-type displacement gauges 16 and ball screw 22 or other drive shaft, which drives the magnetic coupling outer ring 19B, be provided in a solid state in a prescribed location on the ambient air side.

Further, in the above-described aspect of the embodiment, He gas was used as the gas supplied to the backside of a substrate 2, but an inert gas other than this, or another gas can also be used. Further, the piping system for supplying the He gas to the backside of a substrate 2 is not limited to the system disclosed in the embodiment, and any piping system capable of supplying a gas to the backside of a substrate 2 can be used.

Further, in the above-described aspect of the embodiment, the substrate holder 3 has a pair of internal electrodes 6A, 6B, a so-called bipolar-type electrostatic suction electrode, but the same effect can be achieved even when the present invention is used in a single pole-type electrostatic suction electrode. Further, in the above-described aspect of the embodiment, an electrostatic suction-type substrate holder 3 is used, but [the present invention] can also be used even with a substrate holder, which has a surface that is covered by an insulating material, and to which either a ground or a high-frequency power is applied. When the substrate is an insulating material, transfer trouble in particular can occur in accordance with residual suction, and the same effect can be achieved by also using the present invention in a case such as this.

Further, in the above-described aspect of the embodiment, a reactive ion etching-type dry etching apparatus was used, but the plasma generating method is not limited thereto, and inductively coupled-type, ECR-type, helicon wave-type, and surface wave-type plasma generating methods can also be used. Further, in the above-described aspect of the embodiment, an explanation was given using a dry etching apparatus as an example, but the present invention can also be used in a plasma chemical vapor deposition (CVD) apparatus, a sputtering apparatus, and an ashing apparatus.

Further, in the above-described aspect of the embodiment, a case, wherein a magnetic coupling is constituted from an inner ring 19A and an outer ring 19B, was described, but the magnetic coupling is not limited to these shapes. Further, a substrate other than a wafer is also applicable as a substrate 2, and the present invention is optimal for apparatus, in which a substrate 2 is placed in a sealable vessel other than a vacuum chamber, but it is also applicable in cases in which there is no vessel, and a sucked substrate is simply released.

What is claimed is:

1. A device for dechucking an electrically charged substrate held by a residual suction force thereof, comprising:
   a substrate holder for holding a substrate by contacting a side thereof;
   a plurality of lifters for lifting the substrate and selectively protruding or retracting from said substrate holder;
   first and second disk portions operably connected to said a plurality of lifters, respectively;
   a drive source for protruding or retracting said a plurality of lifters;
   a plurality of magnetic coupling portions;
   a first of said magnetic coupling portions operably connected to said first disk portion;
   a second of said magnetic coupling portions operably connected to said second disk portion; and
   a third of said magnetic coupling portions movable by said drive source; and
   said first and second magnetic coupling portions magnetically connected with said third magnetic coupling portion;
   wherein a movement of said third magnetic coupling portion by said drive source causes said first and second magnetic coupling portions to move, thereby protruding or retracting said a plurality of lifters.

2. A device for dechucking an electrically charged substrate held by a residual suction force thereof, comprising:
   a vacuum chamber;
   a substrate holder disposed inside of said vacuum chamber for holding a substrate by contacting a side thereof;
   a plurality of lifters disposed inside of said vacuum chamber for lifting the substrate and selectively protruding or retracting from said substrate holder;
   first and second disk portions operably connected to said a plurality of lifters, respectively;
   a drive source disposed outside of said vacuum chamber for protruding or retracting said a plurality of lifters; and
   a plurality of magnetic coupling portions;
   a first of said magnetic coupling portions operably connected to said first disk portion;
   a second of said magnetic coupling portions operably connected to said second disk portion;
   a third of said magnetic coupling portions movable by said drive source;
   said first and second magnetic coupling portions disposed inside of said vacuum chamber, and said third magnetic coupling portion disposed outside of said vacuum chamber; and
   said first and second magnetic coupling portions magnetically connected with said third magnetic coupling portion;
   wherein a movement of said third magnetic coupling portion by said drive source causes said first and second magnetic coupling portions to move, thereby protruding or retracting said a plurality of lifters.

3. The device according to claim 2, further comprising controlling means including a measuring device for measuring a difference in movement between said first and second magnetic coupling portions and said third magnetic coupling portion in the lifting direction, and controlling the lifting operation by determining a residual suction force between the substrate and said substrate holder based on relationship data between the measured difference in movement, a previously measured difference and stored in a control circuit, and the suction force.

4. The device according to claim 3, wherein said controlling means controls so that the lifting operation is interrupted when a difference in movement between said first and second magnetic coupling portions and said third magnetic coupling portion reaches a predetermined upper limit during the lifting operation.

5. The device according to claim 3, wherein during the lifting operation for reducing a suction force to reduce a residual suction force between the substrate and said substrate holder, said controlling means controls so that the lifting operation for reducing the suction force is stopped and the lifting operation for the next process transfer operation is carried out when the difference in movement between said first and second magnetic coupling portions and said third magnetic coupling portion does not exceed a predetermined lower limit.

6. The device according to claim 3, wherein said measuring device is fixedly connected to said third magnetic coupling portion.

7. The device according to claim 6, wherein said measuring device comprises a transmission-type displacement gauge.

8. The device according to claim 2, wherein said vacuum chamber includes a plasma generating device for electrical charging of the substrate.

9. The device according to claim 2, wherein said substrate holder includes an electrode for electrostatic suction, and the substrate is electrically charged by an electrostatic suction thereof through said substrate holder.

10. A plasma processing apparatus for dry etching a substrate by using plasma, comprising:

a vacuum chamber for accommodating therein a substrate to be subjected to plasma processing;

a vacuum source for evacuating internal gas from said vacuum chamber to create a vacuum therein;

a reaction gas supply source for introducing a reaction gas into said vacuum chamber;

a substrate holder including electrostatic suction electrodes for holding a substrate by suction;

a plasma gas-generating high-frequency power source connected to the electrostatic suction electrodes;

a direct current power source connected to the electrostatic suction electrodes for electrostatic suction of the substrate; and a device for dechucking a processed substrate from the substrate holder;

the substrate dechucking device, comprising:

a pluality of lifters disposed inside of said vacuum chamber for lifting the substrate and selectively protruding or retracting from said substrate holder;

first and second disk portions operably connected to said a plurality of lifters, respectively;

a drive source disposed outside of said vacuum chamber for protruding or retracting said a plurality of lifters; and a plurality of magnetic coupling portions;

a first and said magnetic coupling portions operably connected to said first disk portions;

a seocnd of said magnetic coupling portions operably connected to said second disk portions;

a third of said magnetic coupling portions movable by said drive source;

said first and second magnetic coupling portions disposed inside of said vacuum chamber, and said third magnetic coupling portion disposed outside of said vacuum chamber; and said first and second magnetic coupling portions magnetically connected with said third magnetic coupling portion;

wherein a movement of said third magnetic coupling portion by said drive source causes said first and second magnetic coupling portions to move, thereby protruding or retracting said a plurality of lifters.

* * * * *